(12) United States Patent
Redaelli et al.

(10) Patent No.: US 10,163,982 B2
(45) Date of Patent: Dec. 25, 2018

(54) MULTI-DECK MEMORY DEVICE WITH INVERTED DECK

(71) Applicant: Intel Corporation, Santa Clara, CA (US)

(72) Inventors: Andrea Redaelli, Casatenovo (IT); Innocenzo Tortorelli, Cernusco sul Naviglio (IT); Fabio Pellizzer, Cornate d'Adda Province-MB (IT); Agostino Pirovano, Agrate Brianza (IT); DerChang Kau, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/474,154

(22) Filed: Mar. 30, 2017

(65) Prior Publication Data

US 2018/0286921 A1    Oct. 4, 2018

(51) Int. Cl.
*H01L 27/24* (2006.01)
*H01L 45/00* (2006.01)
*H01L 23/528* (2006.01)
*G11C 13/00* (2006.01)

(52) U.S. Cl.
CPC ........ *H01L 27/2481* (2013.01); *G11C 13/004* (2013.01); *G11C 13/0004* (2013.01); *G11C 13/0069* (2013.01); *H01L 23/528* (2013.01); *H01L 27/2409* (2013.01); *H01L 45/06* (2013.01); *H01L 45/1233* (2013.01); *H01L 45/1253* (2013.01); *H01L 45/143* (2013.01); *H01L 45/144* (2013.01); *H01L 45/1608* (2013.01); *G11C 2013/0092* (2013.01); *G11C 2213/71* (2013.01); *G11C 2213/72* (2013.01)

(58) Field of Classification Search
CPC ............. H01L 27/2463; H01L 27/2481; H01L 27/2409; H01L 27/2427; H01L 45/06; H01L 45/141; H01L 45/143; H01L 45/144; H01L 45/1233
See application file for complete search history.

(56) References Cited

U.S. PATENT DOCUMENTS

| | | | | |
|---|---|---|---|---|
| 7,989,789 | B2 * | 8/2011 | Toda | G11C 11/56 257/2 |
| 8,395,926 | B2 * | 3/2013 | Kreupl | G11C 11/16 365/148 |
| 8,765,581 | B2 | 7/2014 | Lee et al. | |
| 2009/0256133 | A1 | 10/2009 | Kau et al. | |
| 2012/0211716 | A1 * | 8/2012 | Meyer | H01L 45/08 257/2 |
| 2015/0263069 | A1 * | 9/2015 | Jo | H01L 45/085 365/148 |

* cited by examiner

*Primary Examiner* — Allison P Bernstein
(74) *Attorney, Agent, or Firm* — Compass IP Law PC

(57) ABSTRACT

Described herein are multi-deck memory devices with an inverted deck. For example, in one embodiment a memory device includes a first deck of memory cells including layers of material, including a layer of storage material and a layer of selector material, and a second deck of memory cells over the first deck of memory cells, the second deck comprising layers of material in an order opposite relative to the first deck. In one such embodiment, conductive bitlines located between the first and second decks are common to both decks. Inverting the second deck can enable operating the decks symmetrically despite accessing the decks with opposite polarity voltages.

19 Claims, 13 Drawing Sheets

400 ⤵

```
┌─────────────────────────────────────────────────────────┐
│ FORM A FIRST DECK OF MEMORY CELLS, INCLUDING A LAYER OF │
│  SELECTOR MATERIAL AND A LAYER OF STORAGE MATERIAL      │
│ PATTERNED INTO STORAGE ELEMENTS AND SELECTOR ELEMENTS   │
│                          402                            │
└─────────────────────────────────────────────────────────┘
                              │
                              ▼
┌─────────────────────────────────────────────────────────┐
│   FORM LAYERS OF MATERIAL FOR A SECOND DECK OVER THE    │
│  FIRST DECK IN AN ORDER THAT IS OPPOSITE THE ORDER OF   │
│                     THE FIRST DECK                      │
│                          406                            │
└─────────────────────────────────────────────────────────┘
                              │
                              ▼
┌─────────────────────────────────────────────────────────┐
│    PATTERN THE LAYERS OF MATERIAL FOR THE SECOND DECK   │
│   TO FORM THE STORAGE ELEMENTS AND SELECTOR ELEMENTS    │
│                    OF THE SECOND DECK                   │
│                          408                            │
└─────────────────────────────────────────────────────────┘
```

FIG. 4

MULTI-DECK MEMORY DEVICE WITH INVERTED DECK

FIELD

The descriptions are generally related to memory, and more particularly, to a multi-deck three dimensional (3D) cross-point memory device with an inverted deck to enable suppression of polarity dependent performance.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2017, Intel Corporation, All Rights Reserved.

BACKGROUND

Memory resources have innumerable applications in electronic devices and other computing environments. There is demand for memory technologies that can scale smaller than traditional memory devices. One memory technology that can be enable high density memory devices is three-dimensional (3D) cross-point memory.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 4 is a flow diagram of a method of forming an array of memory cells with an inverted deck, in accordance with an embodiment.

Descriptions of certain details and implementations follow, including a description of the figures, which may depict some or all of the embodiments described below, as well as discussing other potential embodiments or implementations of the inventive concepts presented herein.

DETAILED DESCRIPTION

Described herein are multi-deck memory devices with an inverted deck to enable the suppression of polarity-dependent effects in memory technologies such as three-dimensional (3D) cross-point memory.

3D cross-point memory devices typically include one or more decks of memory cells. A "deck" of memory cells can also be referred to as a "tier" or "layer" of memory cells. A deck of memory cells includes a stack of materials (e.g., multiple layers of material), such as a storage material, a selector material, and conductive layers, which are patterned to form an array of memory cells with conductive access lines. Patterning the stack results in "cross-points." A cross-point is an intersection between a bitline, a wordline, and active material(s) (e.g., the selector and/or storage material). The storage material (or memory material) is capable of storing data. The selector material enables accessing a single bit in the array. A multi-deck architecture enables further increasing the density of memory cells in a given area, but can result in undesirable effects during operation of the memory devices.

In one example of a dual deck memory device, two decks are vertically stacked and separated by shared access lines (such as shared or common bitlines for accessing bits in the array of memory cells). Because the two decks have common bitlines, the two decks are operated at opposite polarities, in accordance with embodiments. The memory cells can undergo changes that impact memory cell performance over time that are dependent upon the polarity at which the memory cells were operated. Accordingly, operating the two decks at opposite polarities results in asymmetric memory cell performance in the memory cells of the two decks.

In contrast, embodiments include a multi-deck memory device with an inverted deck. Inverting one of the decks can enable symmetric operation of the decks when opposite polarities are applied to the decks. Thus, an inverted deck enables suppression of polarity-dependent effects in multi-deck memory devices, in accordance with embodiments.

Figure 1:
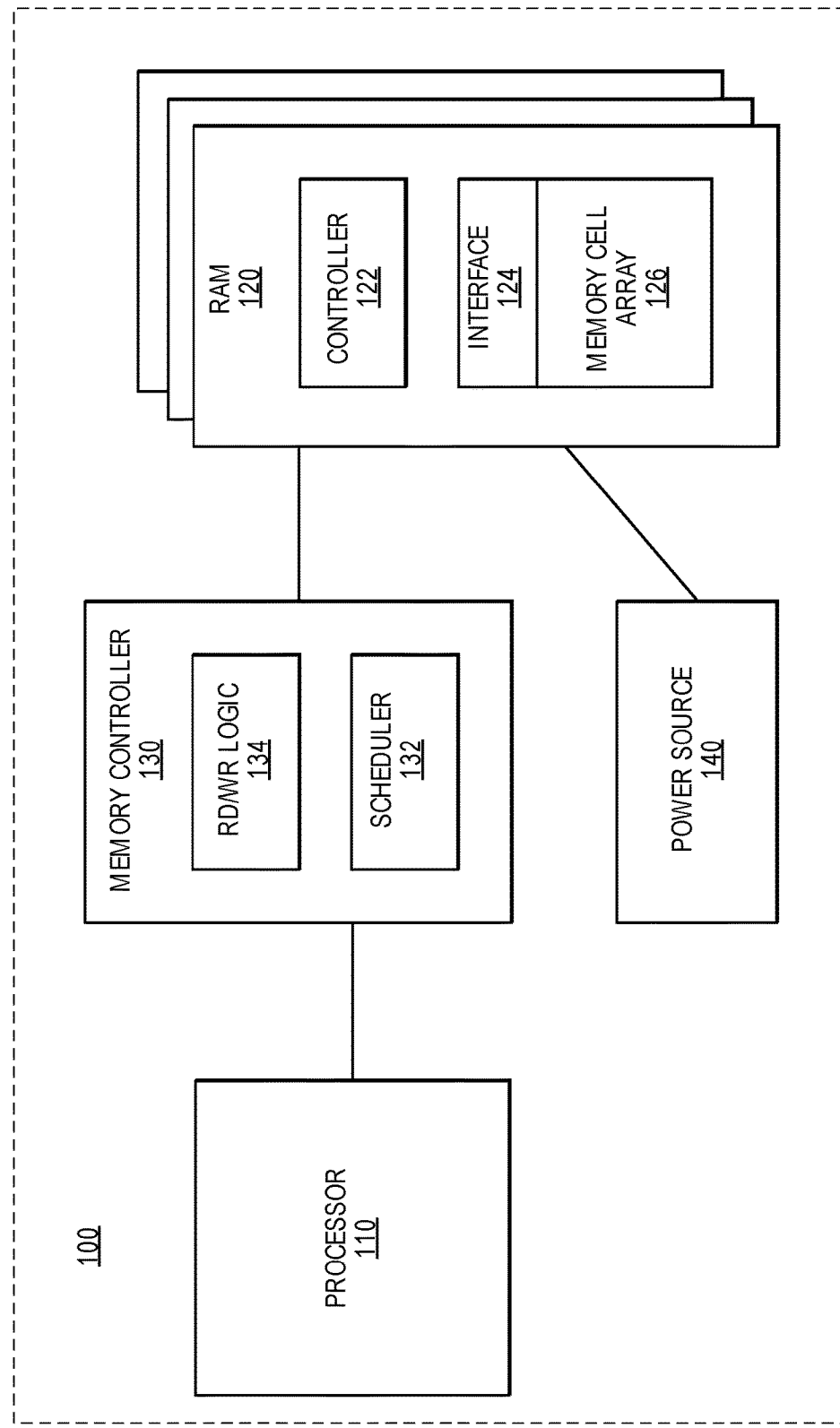
FIG. 1 is a block diagram of a system that can include a memory cell array with an inverted deck, in accordance with an embodiment.

FIG. 1 is a block diagram of a system that can include a memory cell array with an inverted deck, in accordance with an embodiment.

System 100 includes components of a memory subsystem having random access memory (RAM) 120 to store and provide data in response to operations of processor 110. System 100 receives memory access requests from a host or a processor 110, which is processing logic that executes operations based on data stored in RAM 120 or generates data to store in RAM 120. Processor 110 can be or include a host processor, central processing unit (CPU), microcontroller or microprocessor, graphics processor, peripheral processor, application specific processor, or other processor, and can be single core or multicore.

System 100 includes memory controller 130, which represents logic to interface with RAM 120 and manage access to data stored in the memory. In one embodiment, memory controller 130 is integrated into the hardware of processor 110. In one embodiment, memory controller 130 is standalone hardware, separate from processor 110. Memory controller 130 can be a separate circuit on a substrate that includes the processor. Memory controller 130 can be a separate die or chip integrated on a common substrate with a processor die (e.g., as a system on a chip (SoC)). In one embodiment, memory controller 130 is an integrated memory controller (iMC) integrated as a circuit on the processor die. In one embodiment, at least some of RAM 120 can be included on an SoC with memory controller 130 and/or processor 110.

In one embodiment, memory controller 130 includes read/write logic 134, which includes hardware to interface with RAM 120. Logic 134 enables memory controller 130 to generate read and write commands to service requests for data access generated by the execution of instructions by processor 110. In one embodiment, memory controller 130 includes scheduler 132 to schedule the sending of access commands to RAM 120 based on known timing parameters for read and write access for RAM 120. Known timing parameters can be those that are preprogrammed or otherwise preconfigured into system 100. Such parameters can be stored in RAM 120 and accessed by memory controller 130. In one embodiment, at least some parameters are determined by synchronization procedures. The timing parameters can include the timing associated with write latency for RAM 120. The write latency for RAM 120 can depend on the type of memory technology. RAM 120 can be a multi-deck memory with an inverted deck, as is described in further detail below.

The memory resources or cache lines in RAM 120 are represented by memory cell array 126, which can include a memory cell array with chalcogenide storage and/or selector elements. In one such embodiment, the storage elements can be formed from a phase change material that can be electrically switched between a generally amorphous and a generally crystalline state across the entire spectrum between completely amorphous and completely crystalline states. RAM 120 includes interface 124 (e.g., interface logic) to control the access to memory device array 126. Interface 124 can include decode logic, including logic to address specific rows or columns or bits of data. In one embodiment, interface 124 includes logic to control the amount of current provided to specific memory cells of memory device array 126. Thus, control over writing to memory device array 126 can occur through driver and/or other access logic of interface 124. Controller 122 represents an on-die controller on RAM 120 to control its internal operations to execute commands received from memory controller 130. For example, controller 122 can control any of timing, addressing, I/O (input/output) margining, scheduling, and error correction for RAM 120.

In one embodiment, controller 122 is configured to read and write memory device array 126 in accordance with any embodiment described herein. In one embodiment, controller 122 can differentiate between different logic-states as a consequence of the programming polarity of a memory cell. For example, in one embodiment, controller 122 can read a memory cell by applying a voltage drop via interface 124 to the memory cell to determine the state (e.g., one of multiple stable states) of the memory cell.

In one embodiment, when controller 122 is to write to a memory cell, controller 122 applies a voltage pulse to the memory cell. The RAM 120 can be operated at a single or dual polarity. For example, for single polarity operation, programming currents or voltages with different magnitudes, but with the same polarity, are applied to program the storage material. Applying programming currents or voltages with different magnitudes results in the storage material being set or reset to the programmed state. For example, in one embodiment, controller 122 applies a voltage pulse with one magnitude to put the cell in one state (e.g., to write a logic '1'), and applies a voltage pulse with a different magnitude, but at the same polarity, to put the cell in another state (e.g., to write a logic '0'). For dual polarity operation, programming in forward polarity will put the cell in one state and programming in reverse polarity will put the cell in another state, in accordance with embodiments. For example, in one embodiment, controller 122 applies a pulse in one polarity (e.g., bitline positive and wordline negative) to write a value (e.g., a logic '1') or in the other polarity (e.g., bitline negative and wordline positive) to write another value (e.g., a logic '0'). In one such embodiment, controller 122 applies a pulse that is sufficient to trigger the storage material to transition to the desired stable state. System 100 includes power source 140, which can be a voltage source or regulator that provides power to RAM 120. Controller 122 and interface 124 can use the power available from power source 140 to apply a voltage drop to access a memory cell of array 126.

Figure 2:
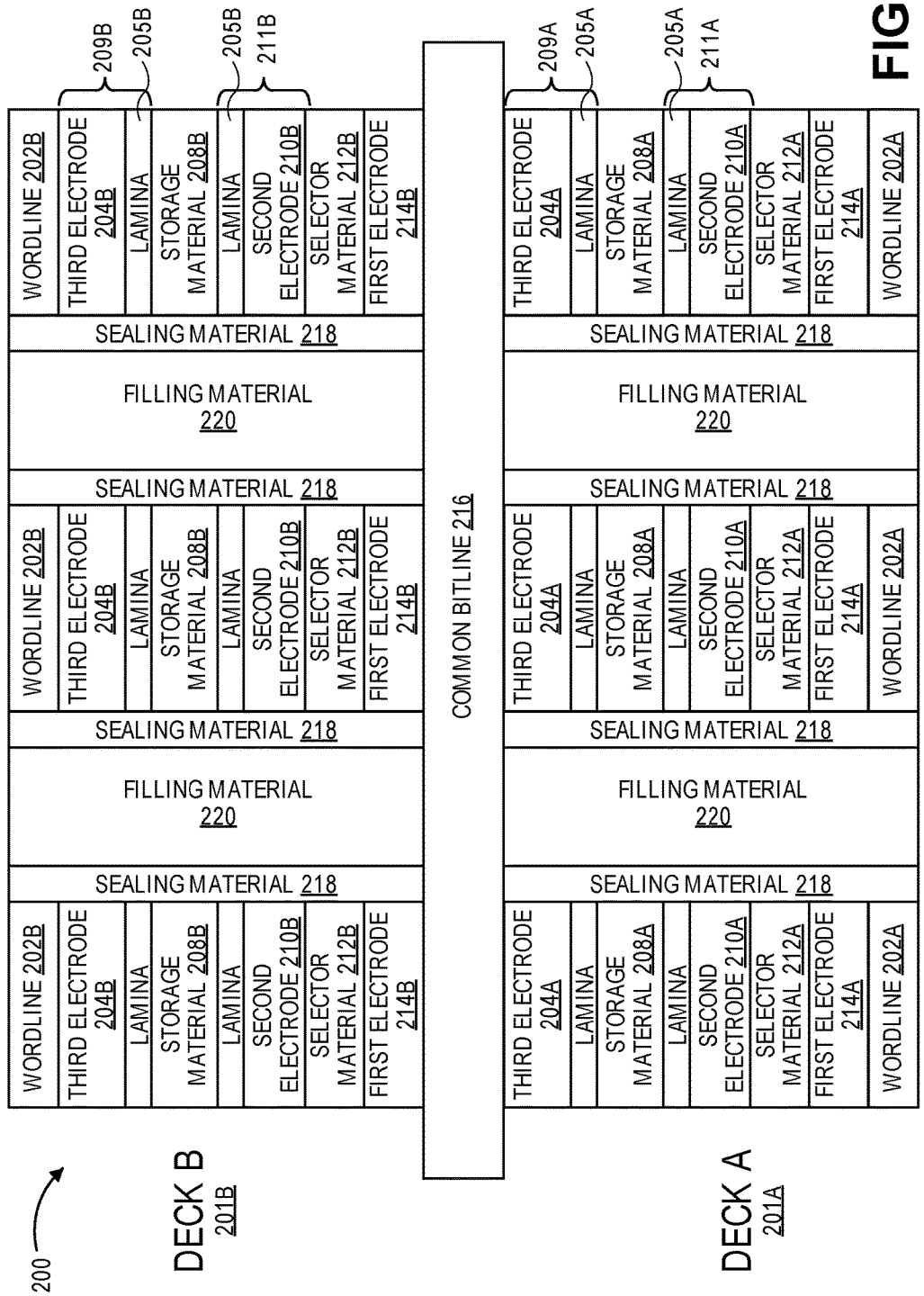
FIG. 2 illustrates a portion of a memory cell array with two decks that have layers of material in the same order, in accordance with an embodiment.

FIG. 2 illustrates a portion of a memory cell array 200 with two decks that have layers of material stacked in the same order. The memory cell array 200 is an example of a three dimensional (3D) cross-point memory structure. The memory cell array 200 has two decks: Deck A (201A) and Deck B (201B). The decks 201A, 201B each have conductive wordlines and the decks 201A, 201B are separated by common bitlines 216. Between the bitlines and wordlines, each of the decks 201A, 201B includes electrodes, selector elements, and storage elements. Thus, in one embodiment, a deck of memory cells includes access lines (e.g., bitlines and wordlines), storage elements, and electrodes. In some embodiments, a deck of memory cells includes selector elements. In some embodiments, a deck of memory cells includes lamina (e.g., such as the lamina 205A and 205B illustrated in FIG. 2). A deck of memory cells can include additional or different elements than the embodiment illustrated in FIG. 2. A given memory cell in the deck includes the storage element and electrodes. A memory cell can also include a selector element, lamina, or both, such as illustrated in FIG. 2. A memory cell can also include another conductive portion (not shown) between the access lines and the electrodes, the conductive access lines (e.g., a portion of the conductive access lines), or both.

In one embodiment, the storage elements 208A, 208B include elements that are programmable to one of multiple states that correspond to logic states. Therefore, the storage elements can be programmed to one of multiple logic states, and thus store information. The storage elements can also be referred to as memory elements. In one embodiment, the storage elements 208A, 208B include a phase change material. A phase change material can be electrically switched between a generally amorphous and a generally crystalline state across the entire spectrum between completely amorphous and completely crystalline states. In another embodiment, the storage material is not a phase change material. In one embodiment in which the storage material is not a phase change material, the storage material is capable of switching between two or more stable states without changing phase. In one embodiment, the storage elements 208A, 208B include a chalcogenide material, such as Te—Se alloys, As—Se alloys, Ge—Te alloys, As—Se—Te alloys, Ge—As—Se alloys, Te—As—Ge alloys, Si—Ge—As—Se alloys, Si—Te—As—Ge alloys, or other chalcogenide materials capable of being programmed to one of multiple states. The storage elements can be programmed by application of a voltage, current, heat, or other physical or electrical stimuli to cause a change in state.

The selector elements 212A, 212B enable accessing a single bit in the array, in accordance with embodiments. In one embodiment, the selector elements 212A, 212B include a chalcogenide material, such a chalcogenide glass, or other material that enables selection of a bit in the array.

The conductive access lines 202A, 202B, and 216 enable access to the memory cells of the array. In embodiments illustrated and described herein, the conductive access lines are sometimes referred to as "bitlines" and "wordlines" for ease of reference. However, the opposite labels can be used for the access lines (e.g., the conductive access lines 202A and 202B can be referred to as bitlines, and the conductive access lines 216 can be referred to as wordlines). In one embodiment, a given one of the wordlines 202A, 202B is for accessing a particular word in a memory array and a given one of the bitlines 216 is for accessing a particular bit in the word, although the logical meaning of the wordlines and bitlines can be reversed. The wordlines 202A, 202B and bitlines 216 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material. Note that, the memory cell array 200 includes shared bitlines between the decks 201A and 201B, which can have the benefit of enabling higher conductance bitlines (and thus enable better signal delivery) and can reduce process related costs. The term "common bitline" can refer to a single bitline, or bitlines for multiple decks that are in electrical contact with one another.

The electrodes 214A, 210A, 204A, 214B, 2108, and 204B are conductive elements or structures that electrically couple the elements that are on either side of the electrode, in accordance with embodiments. The electrodes can also be referred to as conductive contacts or electrode contacts. The electrodes can include the same or different materials as the conductive lines. For example, the electrodes 214A, 210A, 204A, 214B, 2108, and 204B can include one or more conductive and/or semiconductive materials such as: carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials. In one embodiment, conductive wordline layer can include a same or similar conductive material as the electrodes. The electrodes illustrated in FIG. 2 are referred to as "first," "second," and "third" for convenience, but other descriptors can be used. For example, the first electrodes can be referred to as "bottom electrodes," the second electrodes can be referred to as "middle electrodes," and the third electrodes can be referred to as "top electrodes." The electrodes can have the same or different properties. For example, the first, second, and third electrodes can all be composed of the same material and have the same dimensions, or they can include different materials, different dimensions, or both. For example, in the embodiment illustrated in FIG. 2, the second and third electrodes are multi-layer electrodes 209A, 211A, 209B, 211A, and the first electrodes 214A, 214B are not multi-layer electrodes (e.g., electrodes with multiple layers such as a lamina, described below, and a conductive layer). In embodiments, one or more (e.g., two or all) of the electrodes are multi-layer electrodes. In other embodiments, none of the electrodes are multi-layer).

In the embodiment illustrated in FIG. 2, the storage chalcogenide elements 208A, 208B are surrounded on either side by lamina 205A, 205B, respectively. The lamina 205A, 205B can include a thin dielectric layer around the storage material, which can lower the interface resistance and avoid additional parasitic voltage drops, in accordance with embodiments. The lamina can include a dielectric such as AlO, HfO, or another dielectric material. The lamina 205A are disposed under or over an electrode, and in contact with the electrode, in accordance with embodiments. As mentioned above, in one such embodiment, the electrode together with the adjacent lamina can be referred to as a multi-layer electrode. For example, the deck 201A is illustrated as having multi-layer electrodes 209A and 211A, each including a metal electrode layer and a thin dielectric layer. Similarly, the deck 201B is illustrated as having multi-layer electrodes 209B and 211B.

In the embodiment illustrated in FIG. 2, the memory cells are separated from one another physically and electrically via the sealing material 218 and the filling material 220. In one embodiment, sealing material 218 can be a dielectric material. The sealing material can include, for example: silicon oxides, silicon nitrides, silicon oxynitrides, other oxides (such as alumina, hafnium oxides, titanium oxides, zirconium oxides), high-k materials, non-conductive nitrides, or other materials capable of acting as a sealing material. Sealing material 218 can function as an insulator and/or chemical barrier to electrically insulate different structures and protect materials from contamination. The filler material 220 can include the same or different material as the sealing material 218. For example, the filler material 220 can include a dielectric material. The filler material 220 can include, for example, silicon oxide ($SiO_2$), SOD (spin on dielectric), SiN or other suitable dielectric.

In the embodiment illustrated in FIG. 2, both decks 201A and 201B have layers of material in the same order. For example, the deck 201A includes third electrodes 204A over storage chalcogenide elements 208A, which are over second electrodes 210A, which are over selecting chalcogenide elements 212A, which are over first electrodes 214A. The first electrodes 214A are disposed over the wordlines 202A. Similarly, the deck 201B includes third electrodes 204B over storage chalcogenide elements 208B, which are over second electrodes 210B, which are over selecting chalcogenide elements 212B, which are over first electrodes 214B, which land over common bitlines 216 (unlike the deck 201A, which is not disposed over common bitlines). The top deck 201B is disposed over a part of the metallization (e.g., the common bitlines 216) with which the third electrodes 204A of the bottom deck 201A and the first electrodes 214B of the top deck 201B are in contact. Thus, the deck 201B is roughly the same, or a copy of, the deck 201A over which deck 201B is disposed. A benefit of having the orientation of both decks be the same is that it simplifies processing. For example, processing operations can be performed in the same order for each deck.

However, there can be asymmetries in the operation of a memory device with two identical stacked decks, such as the memory cell array 200 of FIG. 2. The asymmetries in the operation can be due to the wordlines and bitline inverted position with respect to the stack orientation. Given that the memory cell array 200 has common bitlines 216 and separate wordlines 202A, 202B, the decks are operated at opposite polarities. For example, deck 201A can be operated by applying a voltage with one polarity (e.g., a higher voltage to the common bitline 216 and a lower voltage to the wordlines 202A) and the deck 201B can be operated by applying a voltage with the opposite polarity (e.g., the same higher voltage to the common bitline 216 and a lower voltage to the wordlines 202B). In one such example, one of the decks 201A, 201B is operated in forward bias and the other of the decks is operated in reverse bias. Because the order of layers of material of the deck 201A and the deck 201B are the same, operating the decks at opposite polarities can induce significant changes in the memory cells of the decks over time. For example, set/reset voltages (the voltage to program a memory cell into one of the two logic states), programming window (the distance in resistance, or threshold voltage, between the two states), thermal disturb resilience (capability to sustain the thermal stress induced by a programing event on a neighbor cell without featuring a retention issue), set-times (the time needed to crystallize an amorphous bit), and drift (the spontaneous increase of the resistance, or threshold voltage, in time and temperature, due to structural relaxation of wrong bonds in amorphous chalcogenide) appear to undergo polarity-dependent changes over time, causing significant differences in cell behavior between the two decks.

The polarity dependent changes in cell performance are mostly due to ion migration in the chalcogenide materials of the cell array (e.g., a selecting chalcogenide, storage chalcogenide, or both), in accordance with embodiments. Due to the decks being operated at opposite polarities, ion migration occurs in the memory cells of each deck in the opposite direction, in accordance with embodiments. For example, referring to the deck 201A, if a voltage is applied to cause current to flow from the common bitlines 216 to the wordlines 202A (or vice versa), some elements in the storage chalcogenide 208A and the selector chalcogenide 212A physically move or migrate. For example, in a chalcogenide material that includes tellurium, germanium, and antimony (such as GeSbTe (germanium-antimony-tellurium), which can be further abbreviated as GST), the tellurium tends to move towards one end of the memory cell (e.g., in the opposite direction of the current), and the antimony and germanium tends to move towards the opposite end of the memory cell (e.g., in the direction of the current). In one such example, if a voltage is applied across the memory cells that causes current to flow from the common bitlines 216 towards the wordlines 202A, the antimony and germanium in the storage chalcogenide elements 208A and the selector chalcogenide elements 212A moves down in the elements towards the wordline 202A. In contrast, if a voltage is applied with the opposite polarity to deck 201B, which would also cause current to flow from the common bitlines 216 towards the wordlines 202B, the antimony and germanium in the storage chalcogenide elements 208B and the selector chalcogenide elements 212B moves up in the elements towards the wordline 202B. Thus, operating the decks so that the bitline is always driven to a higher voltage and the wordline is always grounded or driven to a lower voltage (or vice versa), then the current will flow from top to bottom in one deck and from bottom to top in the other deck. Accordingly, in an array with GST storage and selector elements, there will be a greater concentration of tellurium in the bottom part of the storage and selector elements in one deck, and a greater concentration of tellurium in the top part of the storage and selector elements of the other deck, or vice versa. The same phenomenon can be observed with other elements, such as antimony, arsenic, selenium, silicon, indium, and germanium. The migration of elements such as tellurium, antimony, and germanium in opposite directions in the memory cells of the two decks can cause significant operation and performance problems.

Figure 3A:
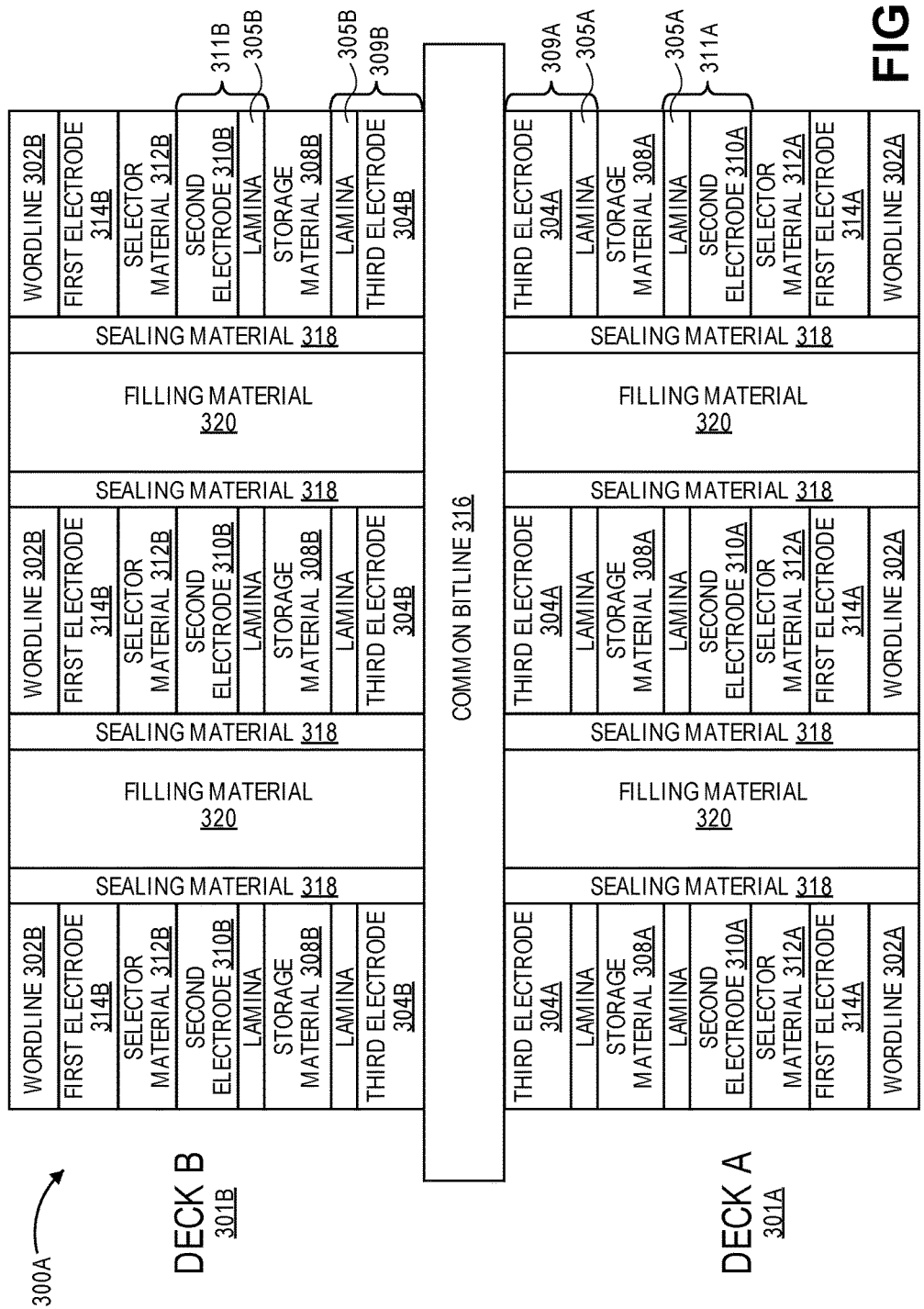
FIGS. 3A and 3B illustrate portions of multi-deck memory cell arrays with inverted decks, in accordance with embodiments.
Figure 3B:
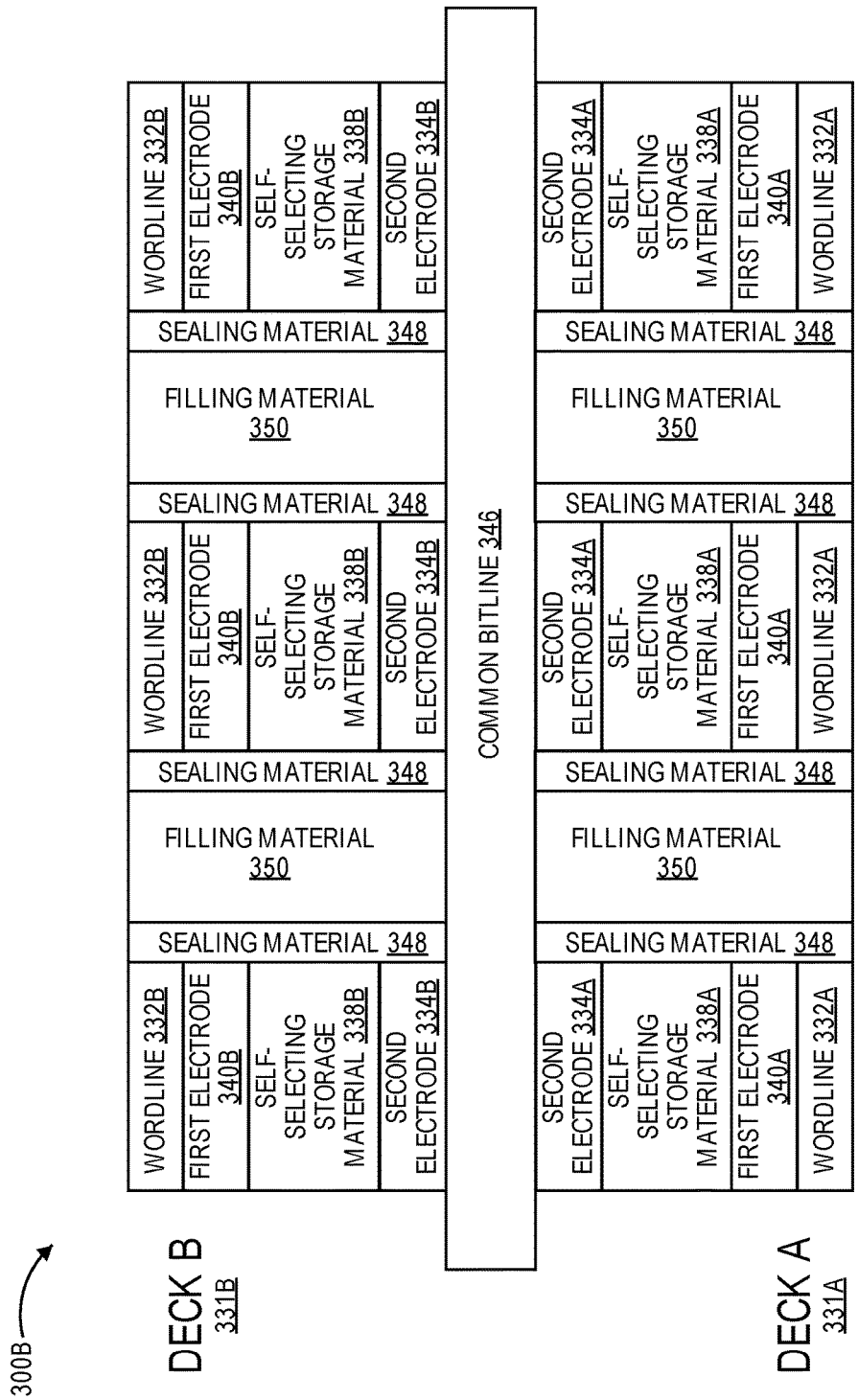

In contrast, FIGS. 3A and 3B illustrate portions of multi-deck memory cell arrays with inverted decks, in accordance with embodiments. FIG. 3A illustrates a memory cell array with separate selector and storage elements, and FIG. 3B illustrates a memory cell array with self-selecting storage elements.

Referring first to FIG. 3A, like FIG. 2, the memory cell array 300A of FIG. 3A includes two decks 301A, 301B of memory cells with common bitlines 316. The deck 301A can be similar to, or the same as, the deck 201A of FIG. 2. For example, in the embodiment illustrated in FIG. 3A, the deck 301A includes third electrodes 304A over storage chalcogenide elements 308A, which are over second electrodes 310A, which are over selecting chalcogenide elements 312A, which are over first electrodes 314A, which are over wordlines 302A. Also similar to FIG. 2, the storage chalcogenide elements 308A are surrounded by lamina 305A. The deck 301B has the same layers (but stacked in the opposite order) as the deck 301A. The storage elements 308A, 308B, the selector elements 312A, 312B, the electrodes 314A, 310A, 304A, 304B, 310B, 314B, the lamina 305A, 305B, the conductive lines 302A, 302B, 316, the sealing material 318, and the filler material 320 can be the same as or similar to the corresponding elements of FIG. 2, described above. FIG. 3A is also illustrated as having multi-layer electrodes 309A, 311A, 309B, and 311B, which can be the same as, or similar to, the multi-layer electrodes described above with respect to FIG. 2.

However, unlike FIG. 2, which includes two identical (layers stacked in the same order) decks separated by the common bitlines 216, the deck 301B is the inverse of deck 301A. Thus, the deck 301B includes layers of material in an order opposite relative to the deck 301A. The deck 301B can therefore be referred to as a mirrored stack relative to the stack of materials that make up the deck 301A across the common bitlines 316. In the example illustrated in FIG. 3A, the order of the selecting chalcogenide elements 312B and the storage chalcogenide elements 308B in deck 301B is reversed relative to deck 301A. For example, in FIG. 3A, the deck 301B includes wordlines 302B over first electrodes 314B, which are over selecting chalcogenide elements 312B, which are over second electrodes 310B, which are over storage chalcogenide elements 308B, which are over third electrodes 304B, which are over the common bit lines 316.

Although the deck 301B is the inverse of deck 301A in terms of the order of elements, the decks 301A and 301B can be operated symmetrically (e.g., identically in terms of voltage bias applied across the memory cells). The decks 301A and 301B share common bitlines 316, and therefore the deck 301B is operated in reverse relative to the deck 301A, as discussed above with respect to FIG. 2. However, the stack of materials in deck 301B is also reversed, so the reverse voltage bias causes the deck 301B to be operated symmetrically relative to the deck 301A. For example, consider a case where accessing the memory cells of deck 301A involves applying a voltage across deck 301A to cause current to flow from the common bitlines 316 down towards the wordlines 302A. In one such embodiment, accessing the memory cells of deck 301B involves applying a voltage across deck 301B, but with the opposite polarity to cause current to flow from the common bitlines 316 up to the wordlines 302B. Thus, in one such embodiment, the top deck is operated in reverse, but because the stack is also reversed, it is as if both decks were operated with voltages having the same polarity. Accordingly, polarity-dependent effects can be the same in both decks 301A and 301B despite the opposite polarity voltages applied to the decks.

Thus, the memory cell array 300A of FIG. 3A differs from existing memory cell arrays in that the top deck 301B is the inverse of the bottom deck 301A. Note that FIG. 3A is one example of how elements of a memory array with an inverse deck can be arranged. However, a memory cell array with an inverse stack can have different, additional, or fewer layers of material that the memory cell array of FIG. 3A. Furthermore, the order of elements or materials in the decks can be different than as shown in FIG. 3A. For example, FIG. 3A shows the bottom deck 301A with storage elements disposed over the selector elements. However, other embodiments can have a bottom deck with selector elements disposed over storage elements (and therefore a top deck with storage elements over selector elements).

FIG. 3B illustrates another embodiment of a memory cell array with an inverse deck. The memory cell array 300B of FIG. 3B is similar to the memory cell array 300A of FIG. 3A in that the top deck includes layers of material in the opposite order as the bottom deck, in accordance with embodiments. However, unlike FIG. 3A, which illustrates a memory cell array with separate storage and selector elements, FIG. 3B illustrates an embodiment with self-selecting storage elements. Thus, the embodiment illustrated in FIG. 3B does not include separate selector elements.

In the illustrated embodiment, each of the decks 331A, 331B includes electrodes, wordlines, and self-selecting storage elements. The electrodes 334A, 340A, 334B, 340B, the conductive lines 332A, 332B, 346, the sealing material 348, and the filler material 350 can be the same as or similar to the corresponding elements of FIG. 2, described above. Note that although FIG. 3B does not illustrate lamina surrounding the self-selecting storage elements 338A, 338B, other embodiments could include one or more lamina (e.g., one or more multi-layer electrodes). The self-selecting storage elements 338A, 338B include a self-selecting storage material. A self-selecting storage material is a material that acts as both a selector and a memory. A self-selecting material enables selection of a memory cell in an array without requiring a separate selector element, and is programmable to one of multiple states to enable the storage of information.

Inverting the top deck 331B relative to the bottom deck 331A results in the first electrodes 334B and second electrodes 340B of top deck 331B being in an order that is opposite to the electrodes of the bottom deck 331A. In the embodiment illustrated in FIG. 3B, inverting the top deck 331B can affect the operation of the memory array if the first and second electrodes are different (e.g., different in dimension, material, or both). For example, in one embodiment with asymmetric electrodes (e.g., first and second electrodes are different), one of the electrode layers (e.g., the first or second electrodes) can provide a larger thermal gradient in the chalcogenide material compared to the other electrode layers, thus promoting ion migration and polarity-dependent effects. Additionally (or alternatively), if the memory cell array 300B were to include additional layers (e.g., if one of the electrodes were a multi-layer electrode including a dielectric layer, or another additional layer), then inverting the top deck 331B relative to the bottom deck 331A can result in symmetric operation of the decks.

Note that although FIGS. 3A and 3B illustrate two decks, memory devices can include more than two decks. For example, in one embodiment, each additional deck can land as the "second deck" or "top deck" on the "first deck" or "bottom deck." For example, in one embodiment, a third deck can share the conductive access lines of the second deck (e.g., the third deck can have conductive wordlines that are common with the conductive wordlines of the second deck). In one such embodiment, the third deck has layers of material in an order that is opposite the second deck. Thus, the same principals described above with respect to FIGS. 3A and 3B can apply to memory devices having more than two decks.

FIG. 4 is a flow diagram of a method of forming an array of memory cells with an inverted deck, in accordance with an embodiment. Method 400 of FIG. 4 can be employed to form an array of memory cells such as the array 300A of FIG. 3A. FIGS. 5A-5F illustrate views of a stack of materials during formation of an array of memory cells, including views corresponding to the operations of the method 400 of FIG. 4, in accordance with embodiments. The operations of the method 400 can be performed by processing equipment capable of performing techniques such as deposition, lithography, and etching. FIG. 10, described below, illustrates an example of processing equipment for performing the operations of process 700.

Referring again to FIG. 4, in one embodiment, the method 400 involves forming a first deck of memory cells, at operation 402. For example, referring to FIG. 3A, processing equipment can form the bottom deck 301A of the memory cell array. Forming the deck of memory cells typically involves deposition and patterning of layers of material. In one embodiment, forming the first deck of memory cells includes forming or depositing multiple layers of material, including a layer of selector material and a layer of storage material, as well as conductive layers for electrodes and access lines. Referring to the example in FIG. 3A, forming the first deck of memory cells involves forming a layer of storage material and selector material over a conductive wordline layer, and forming a conductive bitline layer over the layers of storage and selector material. Formation of the conductive layers for the access lines can include deposition of the same or similar materials for conductive access lines described above with respect to FIG. 2. Note that when a layer is formed or disposed "over" another layer, the stack can include one or more intervening layers. Forming the first deck 301A can also include forming conductive electrode layers, such as conductive electrode layers between the conductive access line layers and the selector or storage material, and conductive electrode layers between the layers of selector and storage material (e.g., conductive electrode layers to form the electrodes 314A, 310A, and 304A). In one embodiment, forming the first deck involves forming multi-layer electrodes, which includes formation of a conductive layer and a dielectric layer (e.g., such as for the multi-layer electrodes 311A and 309A of FIG. 3A).

In one embodiment, formation of a deck of memory cells can involve at least two patterning operations, one patterning operation that defines the memory cells in one direction and conductive access line (e.g., a wordline etch that define the wordlines and the memory cells in the direction of the wordlines), and another patterning operation that defines the memory cells in another direction and other conductive access lines (e.g., a bitline etch that defines the bitlines and the memory cells in the direction of the bitlines). In an embodiment with common access lines (e.g., the common bitlines 316), the common access lines include access lines for each deck that are physically and electrically coupled together. In one such embodiment, forming the first deck involves forming and patterning the access lines for the first deck, over which access lines for a second deck can be subsequently formed.

Thus, forming the first deck involves multiple processing techniques, such as deposition, etching, and lithography, in accordance with embodiments. Processing equipment can employ any suitable process for forming the conductive layers for the wordlines and electrodes, such as electroplating, physical vapor deposition (PVD), chemical vapor deposition, or other process for forming conductive layers. Processing equipment can employ any suitable deposition technique to form the layers of storage and selector material and lamina, such as chemical vapor deposition (CVD), atomic layer deposition (ALD), physical vapor deposition (PVD) such as physical sputtering, plasma-enhanced chemical vapor deposition (PECVD), hybrid physical chemical vapor deposition (HPCVD), or other deposition techniques.

After forming the first deck, the method 400 involves forming layers of material for the second deck in an order that is opposite the first deck, at operation 406. For example, processing equipment forms a layer of storage material and a layer of selector material in the opposite order as the first deck. Forming the layers of material for the second deck can also include forming one or more conductive layers for electrodes (e.g., electrodes 304B, 310B, and 314B of FIG. 3) and access lines (e.g., the access lines 316 and 302B of FIG. 3A) in an order that is opposite the first deck. In one embodiment, forming layers of material for the second deck includes forming lamina, such as described above with respect to FIG. 2. Thus, in one embodiment, forming the second deck can involve forming layers for multi-layer electrodes including a layer of conductive material and a dielectric layer. Forming the layers of material for the second deck can involve the same processing techniques as the first deck.

The method 400 of FIG. 400 further involves patterning the layers of material for the second deck to form storage elements and selector elements, at operation 408. For example, patterning operations can be performed to define the conductive access lines (e.g., a bitline etch operation and a wordline etch operation), which can also define the storage and selector elements in the directions along the conductive access lines, in accordance with embodiments. Thus, forming the second deck involves the same operations to deposit and pattern the same materials, but in a different order, in accordance with embodiments. Processing equipment can employ the same or similar processing techniques to form the second deck of memory cells as the first deck of memory cells. Thus, rather than repeating the same process in the same order for each deck, the process is performed in the reverse order for the second deck to form an inverse deck.

FIGS. 5A-5F illustrate views of a stack of materials during formation of an array of memory cells, in accordance with embodiments. Each of the FIGS. 5A-5F show two views 500A and 500B of the same stack of materials from different directions (e.g., cross-sections in the YX and YZ planes). Note that the coordinate system illustrated in FIGS. 5A-5F is for convenience; other coordinate systems can be used.

Figure 5A:
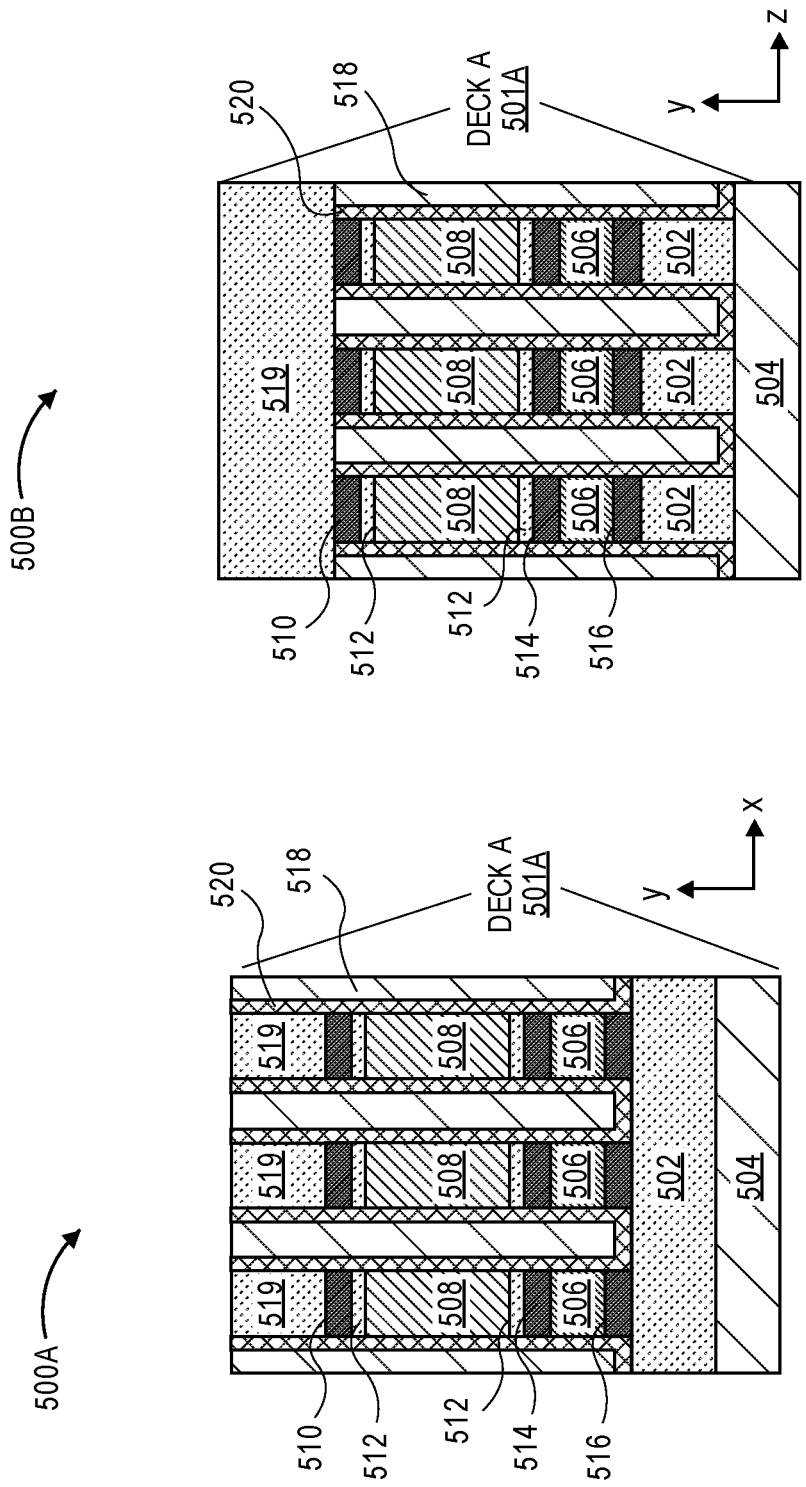
FIGS. 5A-5F illustrate views of a stack of materials during formation of an array of memory cells, in accordance with embodiments.

FIG. 5A illustrates a first deck 501A, in accordance with embodiments. FIG. 5A illustrates an exemplary first deck after performance of the operation 402 of the method 400 of FIG. 4A, in accordance with an embodiment. Referring to FIG. 5A, the first deck 501A (labeled "DECK A") includes conductive wordlines 502 over a dielectric filler layer 504. The storage elements 508 are disposed or located over the selector elements 506. The stack also includes electrodes 510, 514, and 516, which can be the same as or similar to the electrodes described above with respect to FIG. 2 and FIG. 3A. In the embodiment illustrated in FIG. 5A, lamina 512 are located between the top electrode 510 and the storage element 508, and the middle electrode 514 and the storage element 508. Patterned bitlines 519 are disposed over the electrodes 510. In an embodiment with common bitlines, the patterned bitlines 519 form part of, or half of, the common bitlines. For example, the bitlines 519 of the first deck 501A can form the bottom half of the common bitlines (e.g., the bottom half of the common bitlines 316 of FIG. 3A). A sealing material 520 and a filler material 518 separate the memory cells. The sealing material can provide a chemical barrier and electrically isolate the memory cells from one another. The filler material can provide physical support as well as electrically isolating the memory cells from one another. The sealing and filler material can be the same as, or similar to, the materials described above with respect to FIG. 2.

Figure 5B:
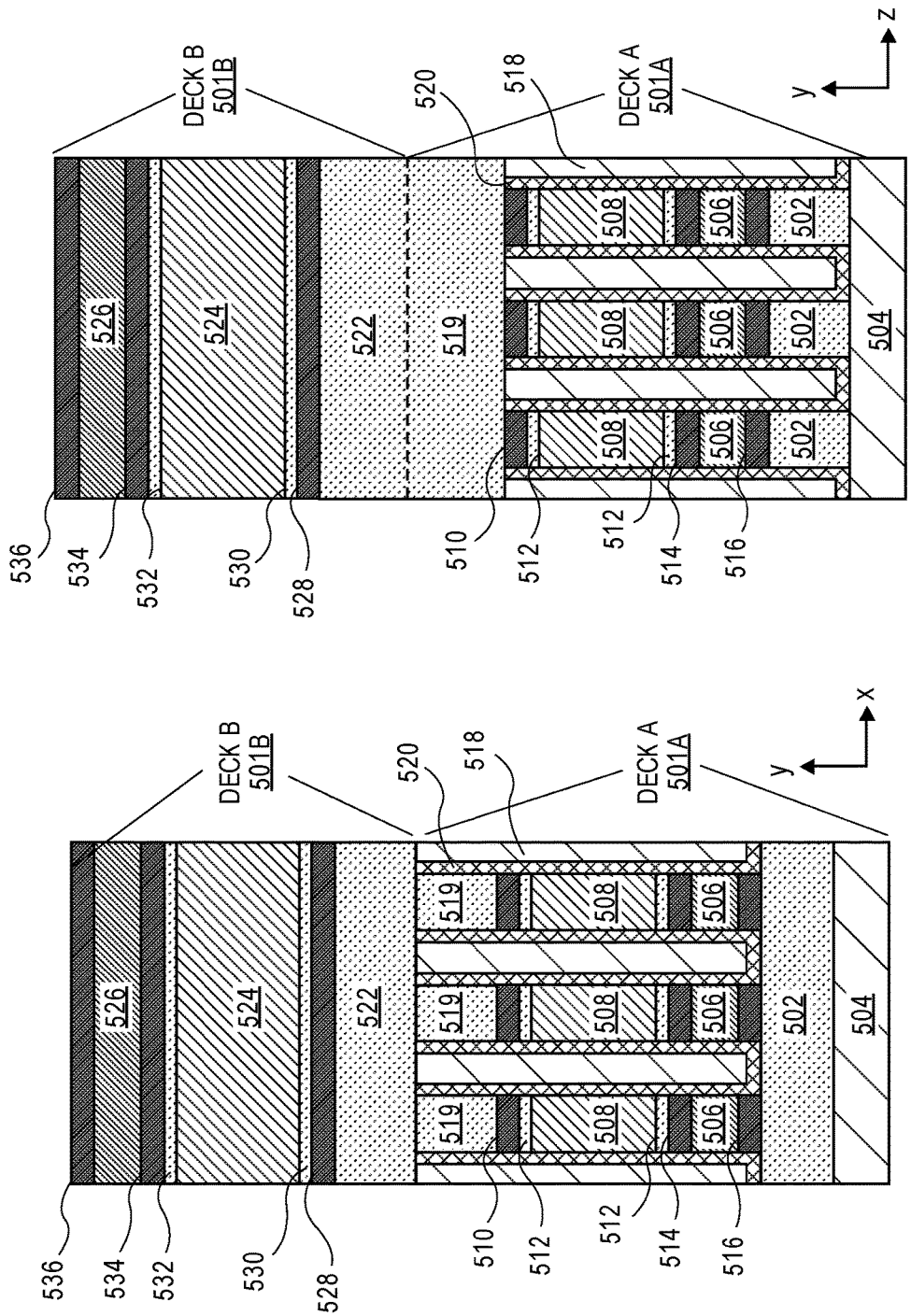

FIG. 5B illustrates the stack of FIG. 5A after deposition of layers of material for the second deck 501B, in accordance with embodiments. FIG. 5B illustrates an exemplary stack after performance of the operations of FIG. 4, in accordance with embodiments. The stack of FIG. 5B illustrates a conductive layer 522 disposed over the first deck 501A. In the illustrated embodiment, the conductive layer 522 is a layer of conductive material to be patterned into bitlines for the second deck 501B (e.g., half of or part of the common bitlines 316 of FIG. 3A, as illustrated by the dotted lines between the bitlines 519 of the first deck 501A and the conductive layer 522 for bitlines of the second deck 501B). Another conductive layer 528 is disposed over the conductive bitline layer 528. The conductive layer 528 is to be patterned into electrodes, in accordance with an embodiment. A lamina 530 is disposed over the conductive electrode layer 528. A layer of storage material 524 is disposed over the lamina 530. The layer of storage material 524 can be the same or similar to the storage materials described above with respect to FIG. 3. Over the layer of storage material 524 is disposed another lamina 532 and another conductive layer 534, which can be patterned into electrodes. A layer of selector material 526 is disposed over the conductive layer 534, and another conductive layer 536 is disposed over the layer of selector material 526. The layer of conductive material 536 can be patterned into electrodes.

Figure 5C:
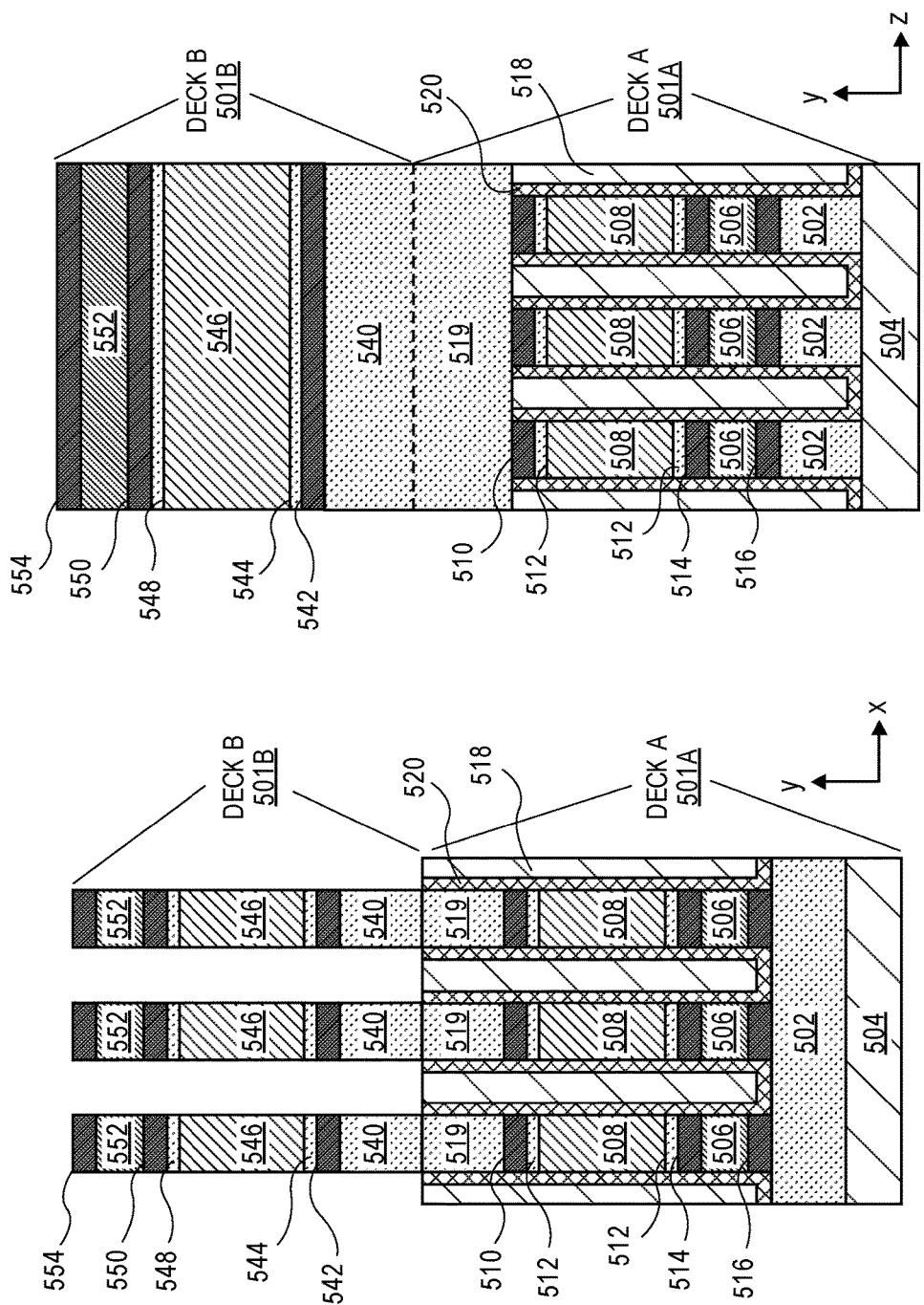
Figure 5D:
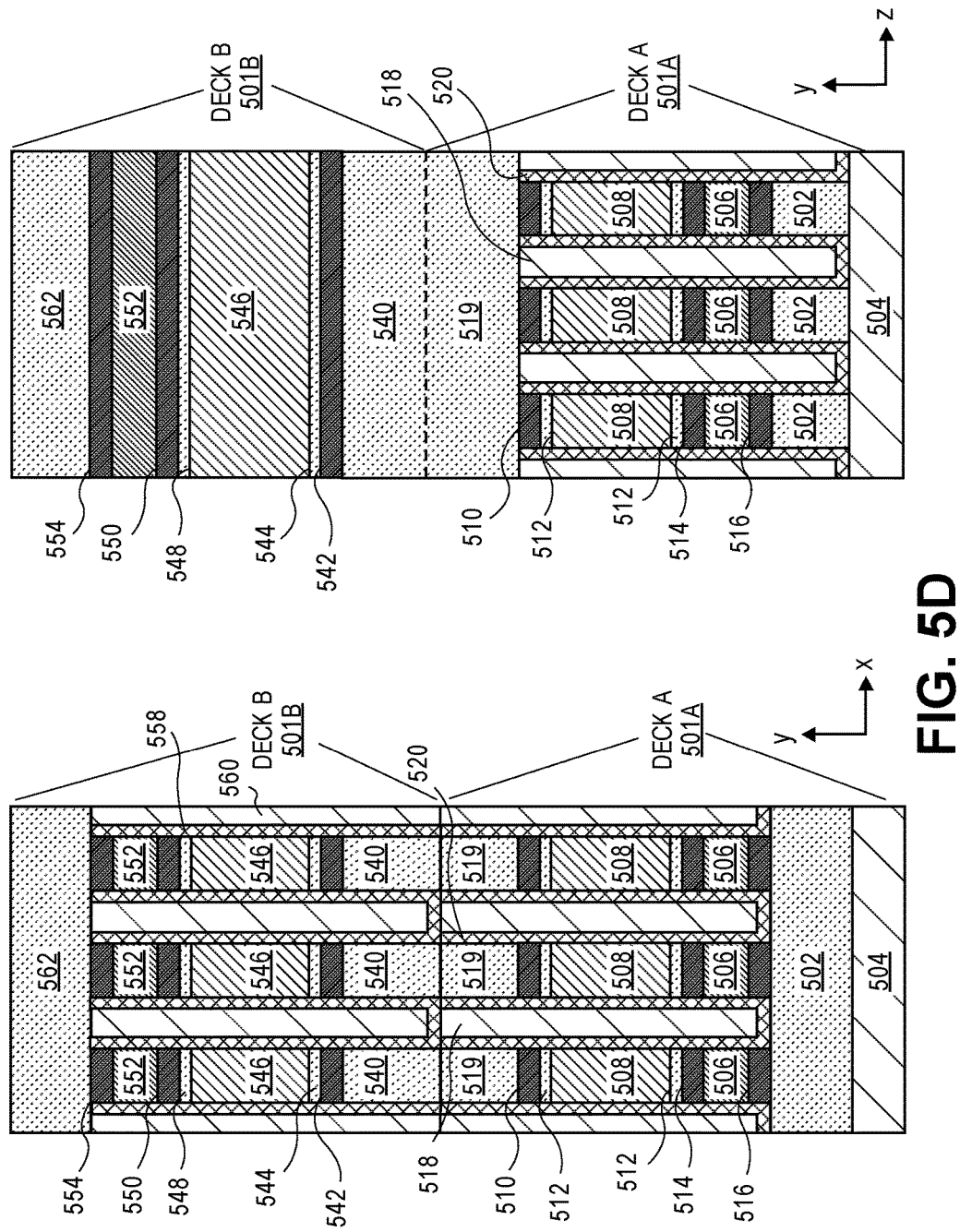
Figure 5E:
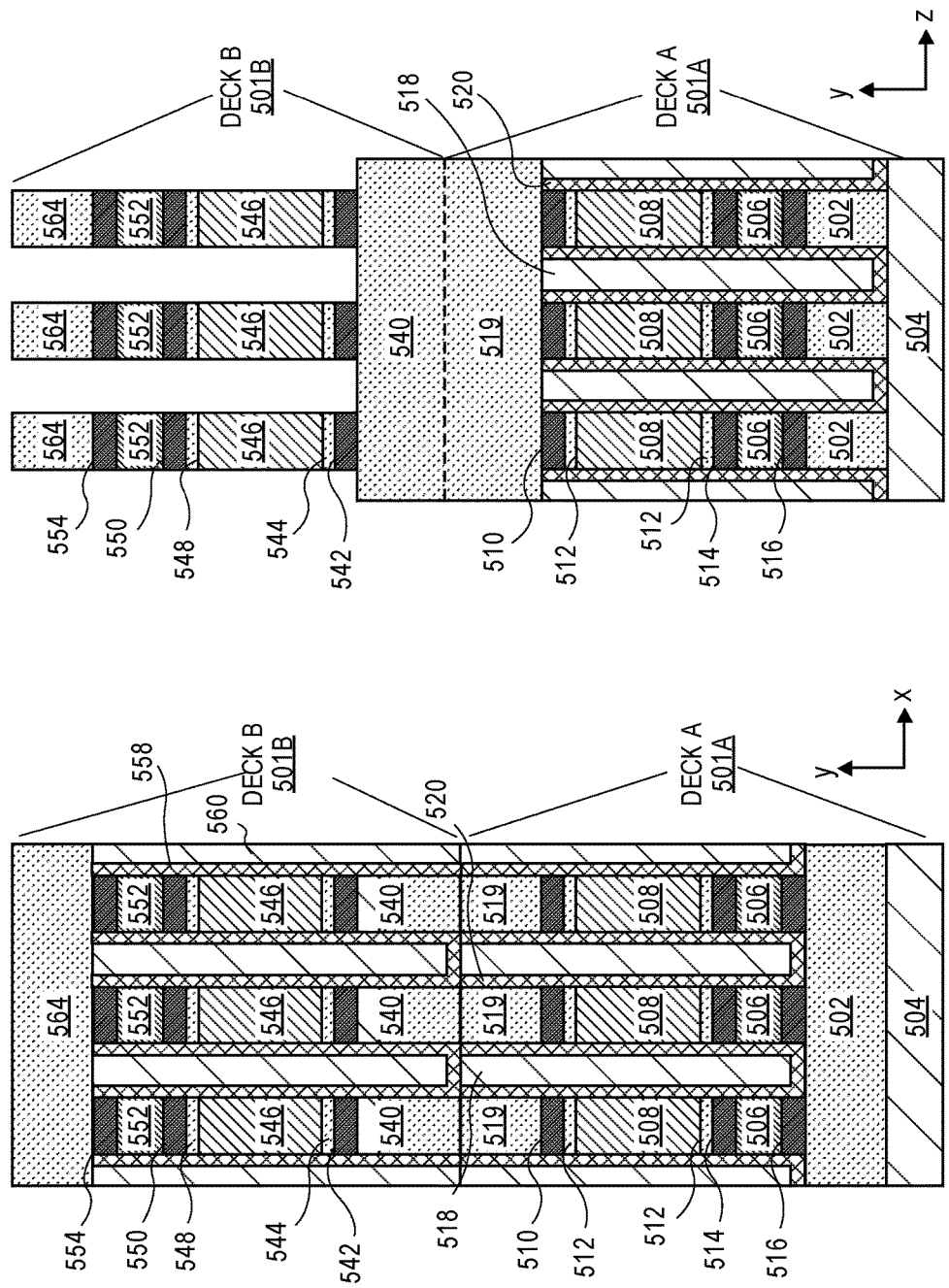

FIGS. 5C-5E illustrate exemplary stacks during the performance of the operation 408 of FIG. 4, in accordance with embodiments. Referring first to FIG. 5C, FIG. 5C illustrates the stack of FIG. 5B after etching to define the bitlines, in accordance with embodiments. Bitline definition as illustrated in FIG. 5C defines the bitlines 540, as well as the storage elements 546, selector elements 552, electrodes 554, 550, and 542, and lamina 544, 548 in the same direction as the bitline definition (e.g., along the x-axis in the example illustrated in FIG. 5C). Patterning the layers can include processing techniques such as deposition and patterning of a mask, and etching through gaps in the patterned mask to pattern the underlying layers. In one embodiment, processing equipment employs a multiple patterning process, such as self-aligned double patterning (SADP) or other multiple patterning process. Different or additional processing operations to define the bitlines are also possible. In one embodiment, stack etching can involve a first etch of the layer selector material 526 and stopping on or at the conductive electrode layer 532. In one such embodiment, after first etch, processing equipment can deposit a partial liner (not shown). After deposition of the partial liner, processing equipment can perform a second etch of the conductive electrode layer 534, lamina 532, layer of storage material 524, lamina 530, conductive electrode layer 528 and conductive bitline layer 522. After defining the bitlines, processing equipment can deposit a sealing, filler, and another conductive layer for the wordlines, in accordance with an embodiment.

FIG. 5D illustrates the stack of FIG. 5C after depositing a sealing and filler material and deposition of a conductive layer for the wordlines, in accordance with embodiments. The sealing material 558 and filler material 560 can be the same as, or similar to, the sealing material 520 and filling materials 518 described above with respect to FIG. 5A. In one embodiment, processing equipment deposits sealing material 558 and filler material 560 as conformal layers. In one embodiment, the thickness of a conformal layer is approximately the same along the entire interface with the underlying layer. However, in other embodiments, sealing material 558 and filler material 560 can be nonconformal layers. After depositing sealing material 558 and filler material 560, in one embodiment, processing equipment performs a CMP (chemical-mechanical planarization) operation on sealing material 558 and filler material 560, stopping on conductive electrodes 554 to expose the electrodes 554 for formation of the conductive wordline layer. Formation of the conductive wordline layer 562 can involve techniques that are the same as, or similar to, the techniques described above for formation of the conductive bitline layer 522. After forming the conductive wordline layer 562, processing equipment etches the stack to define the second wordlines, in accordance with embodiments.

FIG. 5E illustrates the stack of FIG. 5D after etching the conductive wordline layer, in accordance with embodiments. Wordline definition as illustrated in FIG. 5E defines the wordlines 564, as well as the storage elements 546, selector elements 552, and electrodes 554, 550, and 542 in the same direction as the second wordline definition (e.g., along the z-axis in the example illustrated in FIG. 5E). The same or similar processing techniques used to define the bitlines can be employed to define the second wordlines. After defining the wordlines, processing equipment can deposit a sealing, filler, in accordance with an embodiment.

Figure 5F:
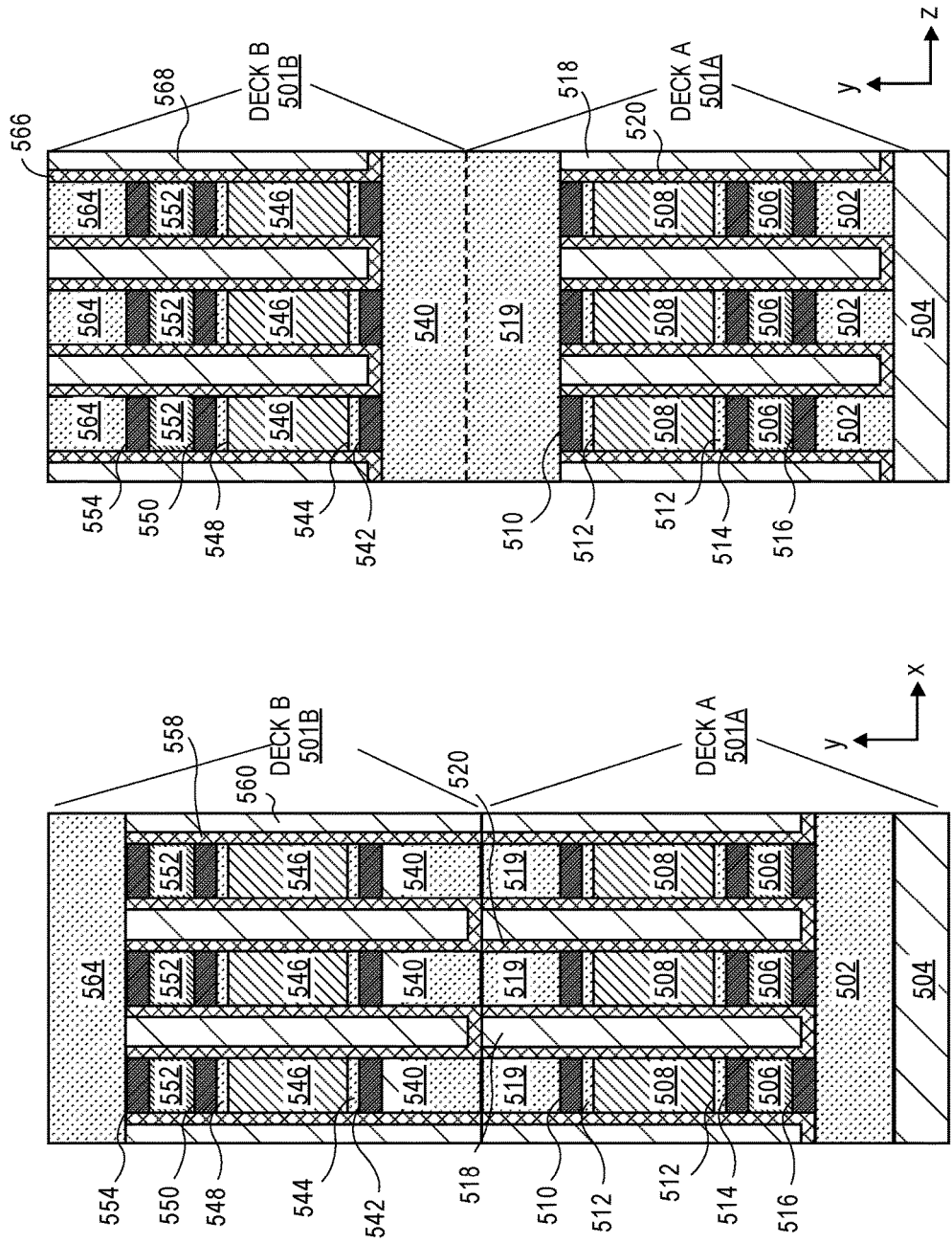

FIG. 5F illustrates the stack of FIG. 5E after depositing a sealing material and a filler material, in accordance with embodiments. The sealing material 566 and the filler material 568 can be the same as, or similar to, the sealing material 520 and the filler material 518. Thus, the stack of FIG. 5F includes two decks of memory cells, including an inverse top deck, in accordance with embodiments.

Figure 6:
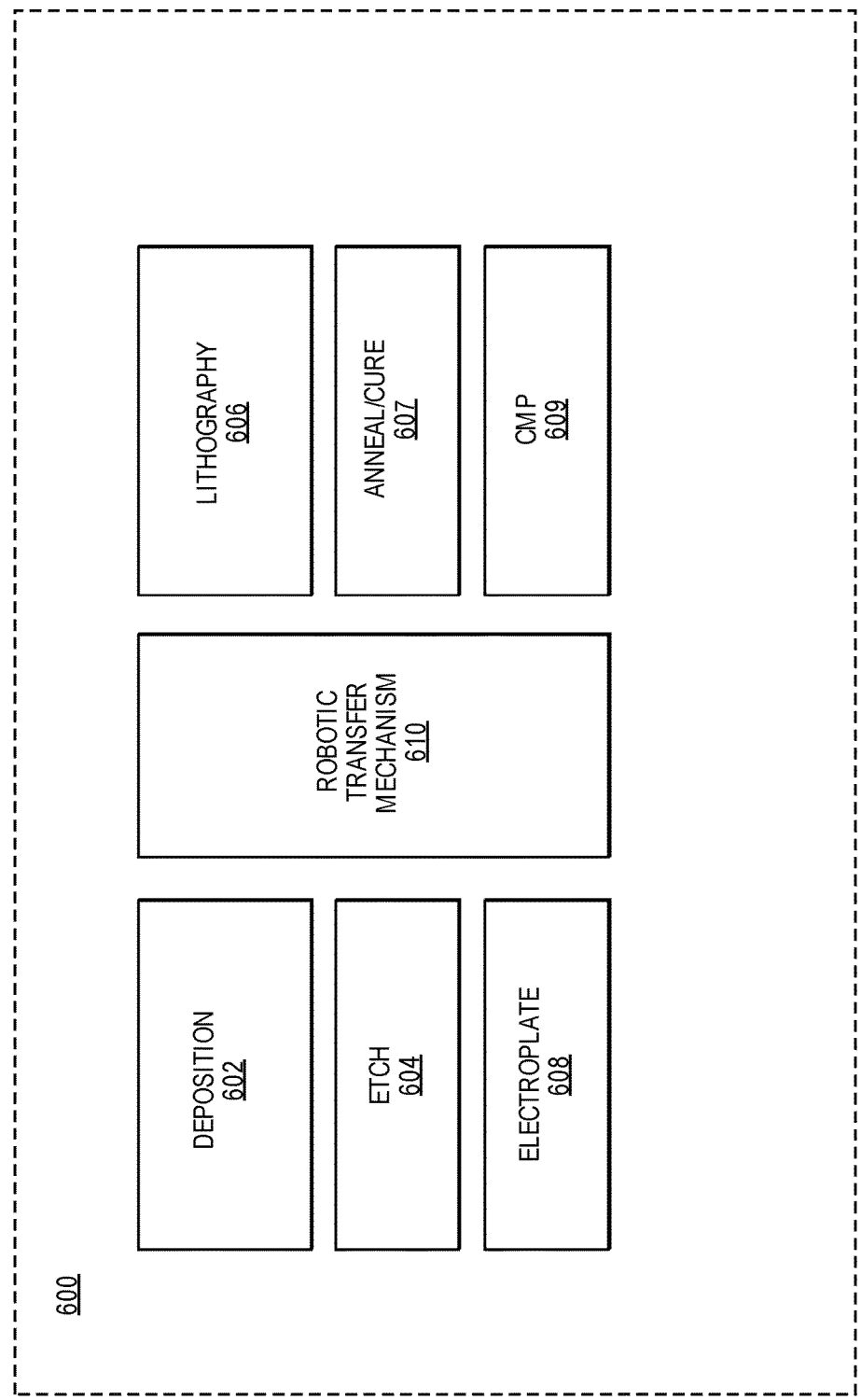
FIG. 6 is a block diagram of exemplary processing equipment for fabricating a memory cell array in accordance with embodiments described herein.

FIG. 6 is a block diagram of exemplary processing equipment for fabricating a memory cell array in accordance with embodiments described herein. Processing equipment 600 can include tools to perform materials processing operations such as deposition, etching (e.g., wet or dry etching, laser etching, or other etch processes), ion implantation, chemical mechanical planarization (CMP), annealing, curing, cleaning, and/or other materials processing operations. As illustrated, processing equipment 600 includes a deposition tool 602, in accordance with embodiments. Although one deposition tool 602 is illustrated, other embodiments can include more than one deposition tool. Deposition tool 602 can include, for example, equipment to perform chemical vapor deposition (CVD), atomic layer deposition (ALD), physical vapor deposition (PVD) such as physical sputtering, plasma-enhanced chemical vapor deposition (PECVD), hybrid physical chemical vapor deposition (HPCVD), or other deposition techniques. Deposition tool 602 can deposit one or more of the layers described herein to form a memory cell array. Processing equipment 600 can also include an electroplating tool 608 to form conductive layers via an electroplating or electrodeposition process.

Processing equipment 600 also includes an etch tool or chamber 604, for example, a wet or dry etch tool. Wet etching can involve, for example, immersing the substrate being processed in a wet etchant, or other wet etching technique. Dry etching can involve, for example, the removal of material by exposing the substrate to bombardment of ions (e.g., via a plasma of reactive gases) that dislodge portions of the material from surfaces of the substrate that are exposed to the ions. Although one etch tool 604 is illustrated, other embodiments can include more than one etch tool. Etch tool 604 can perform etching or patterning operations of methods described herein.

Processing equipment 600 also includes lithography tool 606. Lithography tool 606 can use light to transfer a pattern from a photomask to a light-sensitive chemical "photoresist" on the substrate. Subsequent operations, such as chemical treatments, can then etch the pattern into the material under the photoresist, or enable deposition of a new material in the pattern. Processing equipment also includes an annealing and/or curing tool 607. Annealing/curing tool 607 can include a furnace or other heating mechanism to anneal or cure layers on a substrate.

Processing equipment also includes CMP tool 609. CMP tool 609 can perform chemical mechanical planarization operations by using, for example, a chemical slurry to planarize a surface of a substrate. The tools of processing equipment can be combined into a single tool, can be separate tools. In another embodiment, some tools are combined while others are separate. Robotic transfer mechanisms 610 can transfer the substrate or wafer being processed amongst tools.

Processing equipment includes control logic to operate the equipment and control parameters of the process. In one embodiment, each tool includes its own control logic. The control logic can include hardware logic and/or software/firmware logic to control the processing. The equipment can be programmed or configured to perform certain operations in a certain order. For example, a manufacturing entity can configure processing equipment 600 to perform operations on a wafer or substrate to form electronic circuits. The processing equipment can also include other components of a computer system, such one or more components of system 700 of FIG. 7. For example, in one embodiment, processing equipment can include one or more displays and input devices for managing the processing equipment. A manufacturing entity typically operates the processing equipment.

Figure 7:
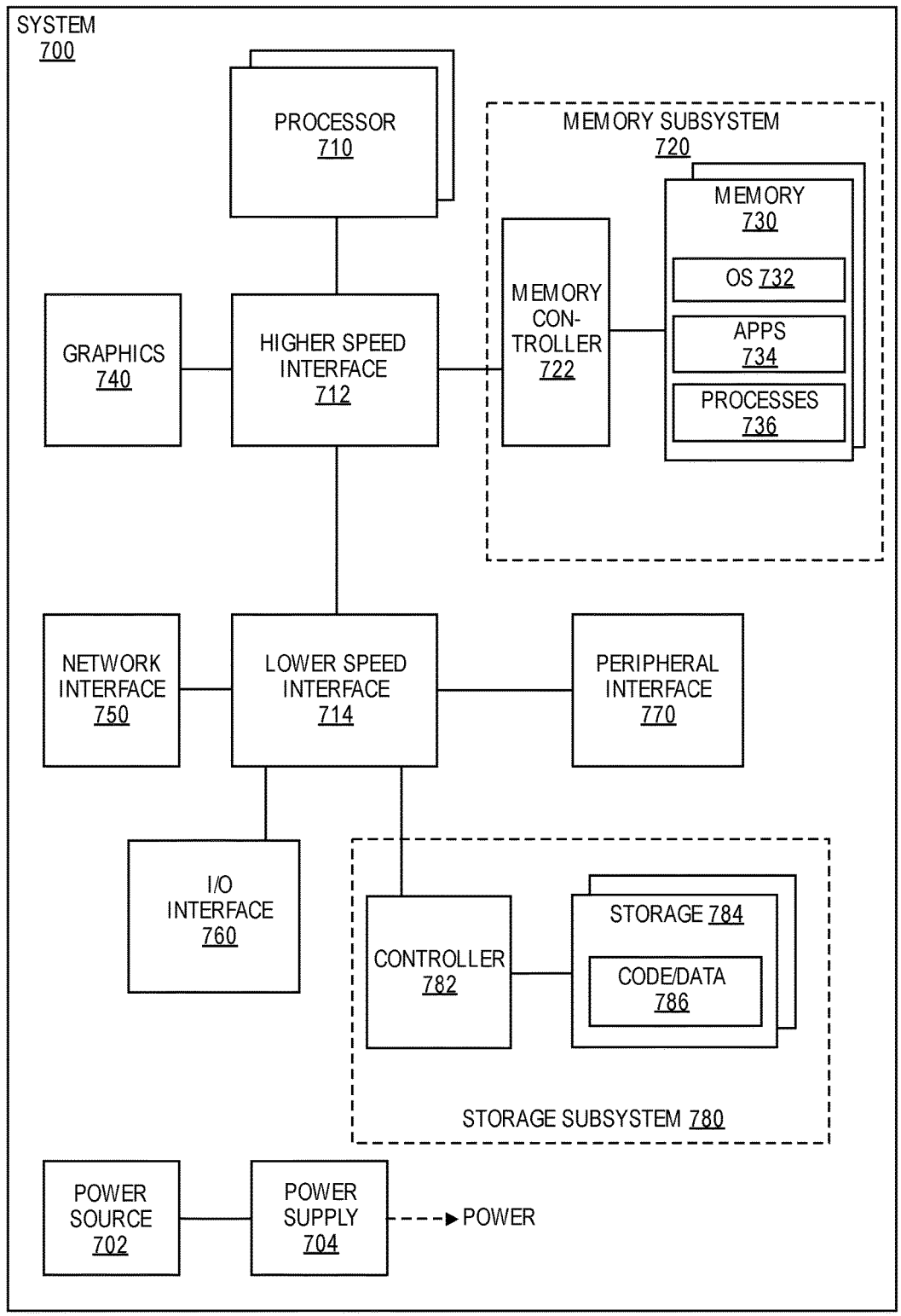
FIG. 7 is a block diagram of a computing system in which a memory device having an inverted top deck of memory cells can be included, in accordance with an embodiment.

FIG. 7 is a block diagram of a computing system in which a memory device having an inverted top deck of memory cells can be included, in accordance with an embodiment.

System 700 represents a computing device in accordance with any embodiment described herein, and can be a laptop computer, a desktop computer, a server, a gaming or entertainment control system, a scanner, copier, printer, routing or switching device, embedded computing device, or other electronic device.

System 700 includes processor 710, which provides processing, operation management, and execution of instructions for system 700. Processor 710 can include any type of microprocessor, central processing unit (CPU), graphics processing unit (GPU), processing core, or other processing hardware to provide processing for system 700, or a combination of processors. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 700 includes interface 712 coupled to processor 710, which can represent a higher speed interface or a high throughput interface for system components that needs higher bandwidth connections, such as memory subsystem 720 or graphics interface components 740. Interface 712 can represent a "north bridge" circuit, which can be a standalone component or integrated onto a processor die. Graphics interface 740 interfaces to graphics components for providing a visual display to a user of system 700. In one embodiment, graphics interface 740 generates a display based on data stored in memory 730 or based on operations executed by processor 710 or both.

Memory subsystem 720 represents the main memory of system 700, and provides storage for code to be executed by processor 710, or data values to be used in executing a routine. Memory subsystem 720 can include one or more memory devices 730 such as read-only memory (ROM), flash memory, one or more varieties of random access memory (RAM), or other memory devices, or a combination of such devices. Memory devices 730 can include memory devices with doped storage and/or selector elements as described herein.

Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide logic to provide functions for system 700. In one embodiment, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire").

In one embodiment, system 700 includes interface 714, which can be coupled to interface 712. Interface 714 can be a lower speed interface than interface 712. In one embodiment, interface 714 can be a "south bridge" circuit, which can include standalone components and integrated circuitry. In one embodiment, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, USB (universal serial bus), or other wired or wireless standards-based or proprietary interfaces. Network interface 750 can exchange data with a remote device, which can include sending data stored in memory or receiving data to be stored in memory.

In one embodiment, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one embodiment, system 700 includes storage subsystem 780 to store data in a nonvolatile manner. In one embodiment, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, or optical based disks, or a combination. Storage 784 holds code or instructions and data 786 in a persistent state (i.e., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (i.e., the value or state of the data is indeterminate if power is interrupted to system 700). In one embodiment, storage subsystem 780 includes controller 782 to interface with storage 784. In one embodiment controller 782 is a physical part of interface 714 or processor 710, or can include circuits or logic in both processor 710 and interface 714.

Power source 702 provides power to the components of system 700. More specifically, power source 702 typically interfaces to one or multiple power supplies 704 in system 700 to provide power to the components of system 700. In one embodiment, power supply 704 includes an AC to DC (alternating current to direct current) adapter to plug into a wall outlet. Such AC power can be renewable energy (e.g., solar power) power source 1102. In one embodiment, power source 702 includes a DC power source, such as an external AC to DC converter. In one embodiment, power source 702 or power supply 704 includes wireless charging hardware to charge via proximity to a charging field. In one embodiment, power source 702 can include an internal battery or fuel cell source.

Some embodiments of the disclosure follow. In one embodiment, memory device includes a first deck of memory cells comprising layers of material, including a layer of storage material and a layer of selector material, and a second deck of memory cells over the first deck of memory cells, the second deck comprising layers of material in an order opposite relative to the first deck.

In one embodiment, the first deck includes the layer of storage material over the layer of selector material, and the second deck includes a second layer of selector material over a second layer of storage material. In one embodiment, the first deck comprises the layer of selector material over the layer of storage material, and the second deck comprises a second layer of storage material over a second layer of selector material. In one embodiment, the memory device includes conductive access lines located between the first deck and the second deck, wherein the conductive access lines are common to both the first and the second deck. In one embodiment, the conductive access lines include conductive bitlines of the first deck and conductive bitlines of the second deck, wherein the conductive bitlines of the first deck are in direct contact with the conductive bitlines of the second deck.

In one embodiment, the memory device includes first conductive wordlines, wherein the layers of selector and storage material of the first deck are between the first conductive wordlines and the conductive bitlines, and second conductive wordlines, wherein the layers of selector and storage material of the second deck are between the second conductive wordlines and the conductive bitlines. In one embodiment, the memory device includes electrodes located: between the first conductive wordlines and the layer of selector material of the first deck, between the conductive bitlines and the layer of storage material of the first deck, between the conductive bitlines and the layer of storage material of the second deck, and between the second conductive wordlines and the layer of selector material of the second deck.

In one embodiment, the memory device further includes electrodes located between the selector material and the storage material of each of the first and second decks. In one embodiment, one or more of the electrodes include multi-layer electrodes, wherein a multi-layer electrode includes a layer of a conductive material and a dielectric layer. In one embodiment, the layer of storage material and the layer of selector material of each of first and second decks include a chalcogenide material. In one embodiment, the layer of storage material of each of the first and second decks includes a phase change chalcogenide material, and the layer of selector material of each of the first and second decks includes a chalcogenide glass.

In one embodiment, a system includes a processor, and a memory device communicatively coupled with the processor, wherein the memory device is in accordance with any of the embodiments described herein. In one embodiment, a system includes any of a display communicatively coupled to the processor, a network interface communicatively coupled to the processor, a battery coupled to provide power to the system, or other system components.

In one embodiment, a memory device includes a first deck of memory cells including layers of material, including a layer of self-selecting storage material between electrodes; and a second deck of memory cells over the first deck of memory cells, the second deck including layers of material in an order opposite relative to the first deck.

In one embodiment, the memory device includes conductive access lines located between the first deck and the second deck, and common to both the first deck and the second deck. In one embodiment, the conductive access lines include conductive bitlines of the first deck and conductive bitlines of the second deck, wherein the conductive bitlines of the first deck are in direct contact with the conductive bitlines of the second deck.

In one embodiment, the memory device further includes first conductive wordlines, wherein the layer of self-selecting storage material of the first deck is between the first conductive wordlines and the conductive bitlines, and second conductive wordlines, wherein the layer of self-selecting storage material of the second deck is between the second conductive wordlines and the conductive bitlines. In one embodiment, the memory device further includes electrodes located: between the first conductive wordlines and the layer of self-selecting storage material of the first deck, between the conductive bitlines and the layer of self-selecting storage material of the first deck, between the conductive bitlines and the layer of self-selecting storage material of the second deck, and between the second conductive wordlines and the layer of self-selecting storage material of the second deck. In one embodiment, the electrodes adjacent to the conductive bitlines comprise a different material or thickness than the electrodes adjacent to the conductive wordlines. In one embodiment, one or more of the electrodes include multi-layer electrodes, wherein a multi-layer electrode includes a layer of a conductive material and a dielectric layer. In one embodiment, the layer of self-selecting storage material includes a chalcogenide material.

In one embodiment, a method of forming a memory device includes forming layers of material for a first deck of memory cells, including forming a layer of storage material and a layer of selector material over a conductive wordline layer, forming layers of material for a second deck of memory cells over the first deck, including forming a second conductive wordline layer, a second layer of storage material and a second layer of selector material in an order opposite the first deck, and patterning one or more of the layers of material of the first and second decks to form the memory cells of the first and second decks.

In one embodiment, forming the layers of material for the second deck includes forming the layers of material for the second deck after patterning the one or more layers of material of the first deck to form the memory cells of the first deck. In one embodiment, forming the layers of material of the first and second decks includes forming the layer of selector material for the first deck over a conductive wordline layer, forming the layer of storage material for the first deck over the layer of selector material for the first deck, forming the layer of storage material for the second deck over a conductive bitline layer, and forming the layer of selector material for the second deck over the layer of storage material for the second deck.

In one embodiment, forming the layer of storage material, forming the layer of selector material, forming the second layer of storage material, and forming the second layer of selector material each involves forming a layer of chalcogenide material. In one embodiment, the method involves forming a conductive wordline layer under the layer of selector material of the first deck, and a second wordline layer over the second layer of selector material of the second deck, forming conductive bitline layers between the layer of storage material of the first deck and the second layer of storage material of the second deck, wherein patterning the one or more layers comprises etching the conductive bitline layers to define conductive bitlines and etching the conductive wordline layer and the second conductive wordline layer to form conductive wordlines.

In one embodiment, the method further involves forming conductive electrode layers: between the first conductive wordline layer and the layer of selector material of the first deck, between the layer of storage material of the first deck the conductive bitline layer, between the conductive bitline layer and the second layer of storage material of the second deck, and between the second conductive wordline layer and the second layer of selector material of the second deck. In one embodiment, forming a conductive electrode layer involves forming a metal layer and a dielectric layer.

In one embodiment, a method involves forming layers of material for a first deck of memory cells, including forming a layer of self-selecting storage material over a conductive wordline layer, forming layers of material for a second deck of memory cells over the first deck in an order opposite the first deck, wherein the layers of material for a second deck include a second conductive wordline layer and a second layer of self-selecting storage material, and patterning one or more of the layers of material of the first and second decks to form the memory cells of the first and second decks.

In one embodiment, forming the layers of material for the second deck involves forming the layers of material for the second deck after patterning the one or more layers of material of the first deck to form the memory cells of the first deck. In one embodiment, forming the layers of material of the first and second decks involves forming the layer of self-selecting storage material for the first deck over a conductive wordline layer and forming the second layer of self-selecting storage material for the second deck over a conductive bitline layer. In one embodiment, forming the layer of self-selecting storage material and forming the second layer of self-selecting storage material each involves forming a layer of chalcogenide material.

In one embodiment, the method involves forming a conductive wordline layer under the layer of self-selecting storage material of the first deck, and a second wordline layer over the second layer of self-selecting storage material of the second deck, and forming conductive bitline layers between the layer of self-selecting storage material of the first deck and the second layer of storage material of the second deck, wherein patterning the one or more layers comprises etching the conductive bitline layers to define conductive bitlines and etching the conductive wordline layer and the second conductive wordline layer to form conductive wordlines. In one embodiment, the method further involves forming conductive electrode layers: between the first conductive wordline layer and the layer of self-selecting storage material of the first deck, between the layer of self-selecting storage material of the first deck the conductive bitline layer, between the conductive bitline layer and the second layer of self-selecting storage material of the second deck, and between the second conductive wordlines. In one embodiment, forming a conductive electrode layer involves forming a metal layer and a dielectric layer. In one embodiment, forming the conductive electrode layers involves forming one or more of the conductive electrode layers with a material or thickness that is different than the other conductive electrode layers.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
   a first deck of memory cells comprising layers of material, including a layer of chalcogenide storage material, a layer of selector material, and multi-layer electrodes including a first multi-layer electrode between a conductive access line and the layer of chalcogenide storage material and a second multi-layer electrode between the layer of chalcogenide storage material and the layer of selector material, each of the first and second multi-layer electrodes including a dielectric layer and a conductive layer, the dielectric layer between and in contact with the layer of chalcogenide storage material and the conductive layer; and
   a second deck of memory cells over the first deck of memory cells, the second deck comprising layers of material in an order opposite relative to the first deck.

2. The memory device of claim 1, wherein:
   the first deck comprises the layer of chalcogenide storage material over the layer of selector material; and
   the second deck comprises a second layer of selector material over a second layer of storage material.

3. The memory device of claim 1, wherein:
   the first deck comprises the layer of selector material over the layer of chalcogenide storage material; and
   the second deck comprises a second layer of storage material over a second layer of selector material.

4. The memory device of claim 1, further comprising:
   conductive access lines including the conductive access line, the conductive access lines located between the first deck and the second deck, wherein the conductive access lines are common to both the first and the second deck.

5. The memory device of claim 4, wherein:
   the conductive access lines comprise conductive bitlines common to both the first deck and the second deck.

6. The memory device of claim 5, further comprising:
   first conductive wordlines, wherein the layers of selector and storage material of the first deck are between the first conductive wordlines and the conductive bitlines; and
   second conductive wordlines, wherein and the layers of selector and storage material of the second deck are between the second conductive wordlines and the conductive bitlines.

7. The memory device of claim 6, further comprising:
   electrodes located:
     between the first conductive wordlines and the layer of selector material of the first deck; and
     between the second conductive wordlines and the layer of selector material of the second deck.

8. The memory device of claim 1, wherein:
   the layer of storage material of the second deck and the layer of selector material of each of first and second decks comprise a chalcogenide material.

9. The memory device of claim 8, wherein:
   the layer of chalcogenide storage material of the first deck and the layer of storage material of the second deck comprise phase change chalcogenide material; and
   the layer of selector material of each of the first and second decks comprises a chalcogenide glass.

10. A system comprising:
a processor; and
a memory device communicatively coupled with the processor, the memory device comprising:
  a first deck of memory cells comprising layers of material, including a layer of chalcogenide storage material, a layer of selector material, and multi-layer electrodes including a first multi-layer electrode between a conductive access line and the layer of chalcogenide storage material and a second multi-layer electrode between the layer of chalcogenide storage material and the layer of selector material, each of the first and second multi-layer electrodes including a dielectric layer and a conductive layer, the dielectric layer between and in contact with the layer of chalcogenide storage material and the conductive layer; and
  a second deck of memory cells over the first deck of memory cells, the second deck comprising layers of material in an order opposite relative to the first deck.

11. The system of claim 10, wherein:
the first deck comprises the layer of chalcogenide storage material over the layer of selector material; and
the second deck comprises the layer of selector material over the layer of storage material.

12. The system of claim 10, wherein the memory device further comprises:
conductive access lines including the conductive access line, the conductive access lines located between the first deck and the second deck, wherein the conductive access lines are common to both the first deck and the second deck.

13. The system of claim 12, wherein:
the conductive access lines comprise conductive bitlines common to both the first deck and the second deck.

14. The system of claim 13, wherein the memory device further comprises:
first conductive wordlines, wherein the layers of selector and storage material of the first deck are between the first conductive wordlines and the conductive bitlines; and
second conductive wordlines, wherein and the layers of selector and storage material of the second deck are between the second conductive wordlines and the conductive bitlines.

15. The system of claim 14, wherein the memory device further comprises:
electrodes located:
  between the first conductive wordlines and the layer of selector material of the first deck; and
  between the second conductive wordlines and the layer of selector material of the second deck.

16. The system of claim 10, further comprising: any of a display communicatively coupled to the processor, a network interface communicatively coupled to the processor, or a battery coupled to provide power to the system.

17. A memory device comprising:
a first deck of memory cells comprising layers of material, including a layer of self-selecting storage material between a first electrode and a second electrode, the self-selecting storage material comprising a self-selecting chalcogenide to both select a memory cell in an array and store data, wherein only one of the first and second electrodes includes a dielectric layer between the layer of self-selecting storage material and a conductive electrode layer; and
a second deck of memory cells over the first deck of memory cells, the second deck comprising layers of material in an order opposite relative to the first deck.

18. The memory device of claim 17, further comprising:
conductive bitlines located between the first deck and the second deck.

19. The memory device of claim 18, wherein:
the conductive bitlines are common to both the first deck and the second deck.

* * * * *